United States Patent
Chen et al.

(10) Patent No.: US 10,827,836 B2
(45) Date of Patent: Nov. 10, 2020

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd, Kaohsiung (TW)

( * ) Notice: Subject to any disclaimer, the term of this patent is extended or adjusted under 35 U.S.C. 154(b) by 21 days.

(21) Appl. No.: 16/244,337

(22) Filed: Jan. 10, 2019

(65) Prior Publication Data

US 2020/0077793 A1    Mar. 12, 2020

(30) Foreign Application Priority Data

Sep. 10, 2018  (TW) .............................. 107131966 A

(51) Int. Cl.
*A47B 88/487* (2017.01)
*A47B 88/423* (2017.01)

(52) U.S. Cl.
CPC .... *A47B 88/487* (2017.01); *A47B 2088/4235* (2017.01); *A47B 2210/0016* (2013.01); *A47B 2210/0032* (2013.01); *A47B 2210/0059* (2013.01); *A47B 2210/0081* (2013.01)

(58) Field of Classification Search
CPC .......... A47B 88/487; A47B 2088/4235; A47B 2210/0016; A47B 2210/0081
See application file for complete search history.

(56) References Cited

U.S. PATENT DOCUMENTS

| 5,722,750 | A | 3/1998 | Chu | |
|---|---|---|---|---|
| 6,254,210 | B1 | 7/2001 | Parvin | |
| 6,655,763 | B2 * | 12/2003 | Judge | H05K 7/1489 312/334.11 |
| 6,799,817 | B1 | 10/2004 | Chu | |
| 6,851,773 | B2 | 2/2005 | Chen et al. | |
| 7,571,968 | B2 | 8/2009 | Ji et al. | |

(Continued)

FOREIGN PATENT DOCUMENTS

| JP | 3163904 U | 11/2010 |
|---|---|---|
| JP | 3187607 U | 12/2013 |

*Primary Examiner* — Eret C McNichols
(74) *Attorney, Agent, or Firm* — Alan D. Kamrath; Karin L. Williams; Mayer & Williams PC

(57) ABSTRACT

A slide rail assembly includes a first rail, a second rail, a slide assisting device, an engaging member and a supporting structure. The slide assisting device is configured to assist in relative movement between the second rail and the first rail. The engaging member and the supporting structure are arranged on the first rail. The second rail is movable from a retraced position along a first direction to be detached from the first rail. When the second rail is moved along the first direction and detached from the first rail, the slide assisting device is moved to be adjacent to the engaging member. During a process of the second rail being moved from a passage entrance of the first rail toward the retracted position along a second direction, the supporting structure is configured to support the second rail, and is extended beyond the engaging member along the first direction.

17 Claims, 9 Drawing Sheets

(56) References Cited

U.S. PATENT DOCUMENTS

| | | | | |
|---|---|---|---|---|
| 7,648,214 B2* | 1/2010 | Chen | ............... | A47B 88/493 |
| | | | | 312/333 |
| 8,403,432 B2* | 3/2013 | Chen | ............... | A47B 88/43 |
| | | | | 312/333 |
| 9,992,906 B2 | 6/2018 | Chen et al. | | |
| 10,413,065 B2* | 9/2019 | Chen | ............... | A47B 88/473 |
| 10,413,066 B2* | 9/2019 | Chen | ............... | A47B 88/49 |
| 2004/0174100 A1* | 9/2004 | Chen | ............... | A47B 88/50 |
| | | | | 312/333 |
| 2005/0017614 A1 | 1/2005 | Cirocco et al. | | |
| 2006/0244349 A1* | 11/2006 | Chen | ............... | A47B 88/493 |
| | | | | 312/334.47 |
| 2008/0141496 A1* | 6/2008 | Peng | ............... | A47B 88/423 |
| | | | | 16/94 R |
| 2009/0096340 A1* | 4/2009 | Chen | ............... | A47B 88/493 |
| | | | | 312/334.46 |
| 2012/0076446 A1* | 3/2012 | Chen | ............... | A47B 88/43 |
| | | | | 384/21 |
| 2013/0058596 A1 | 3/2013 | Chen et al. | | |

* cited by examiner

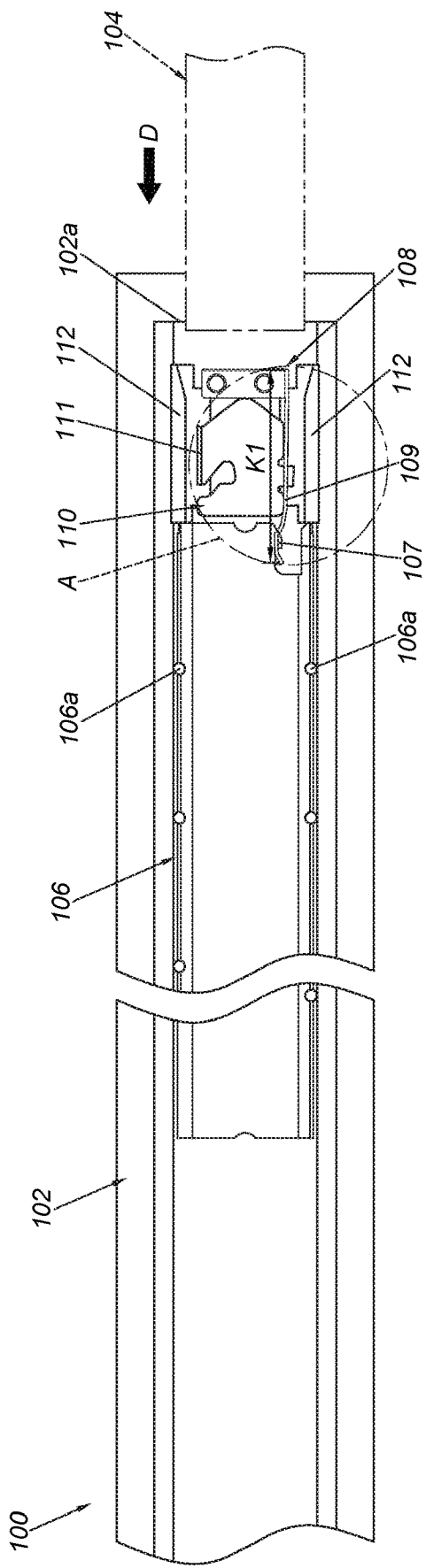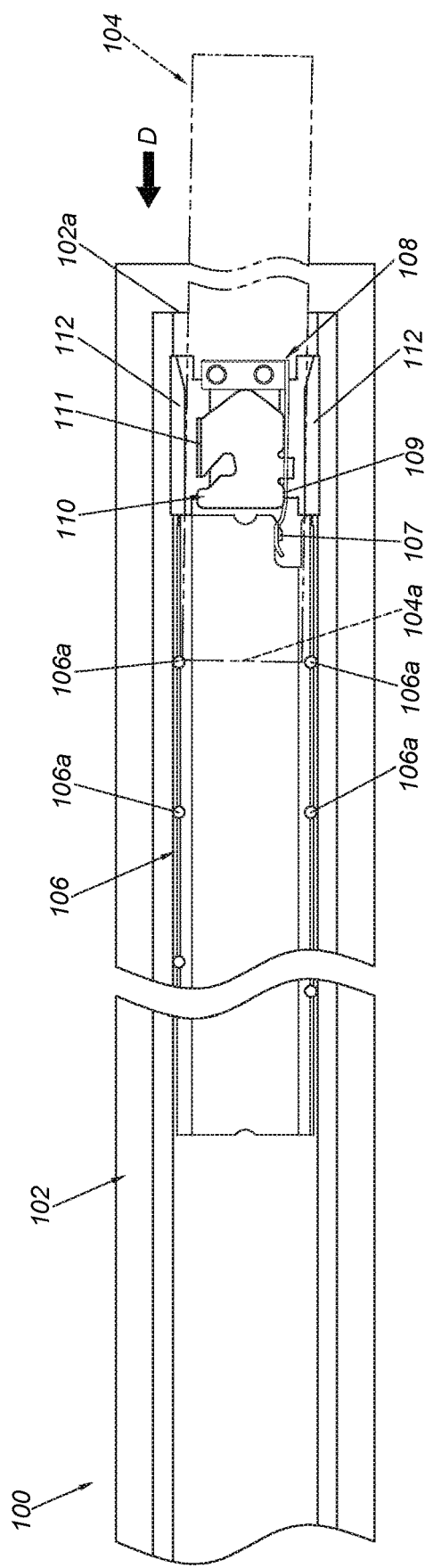

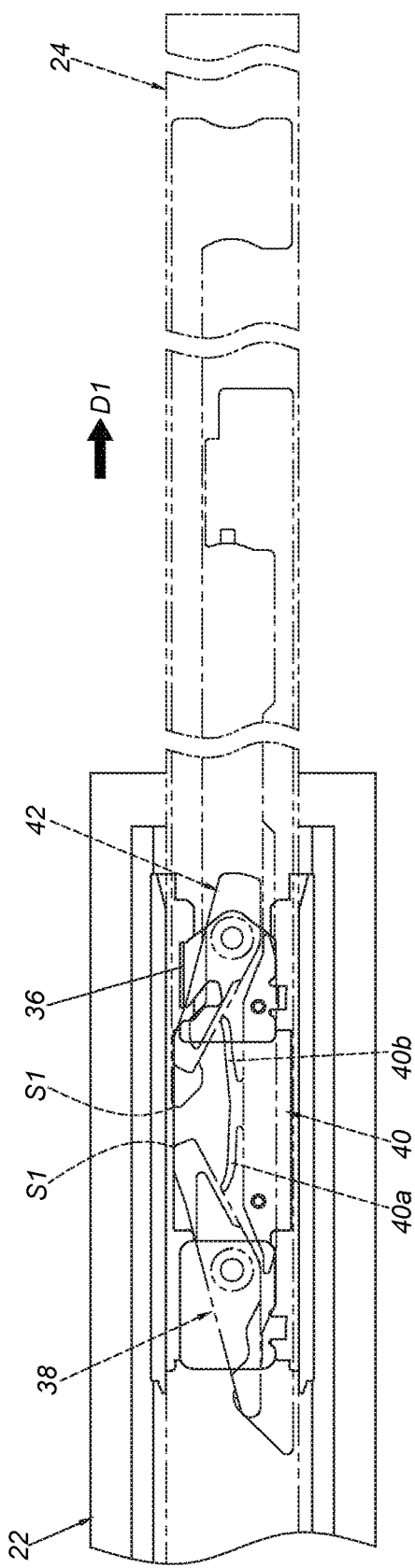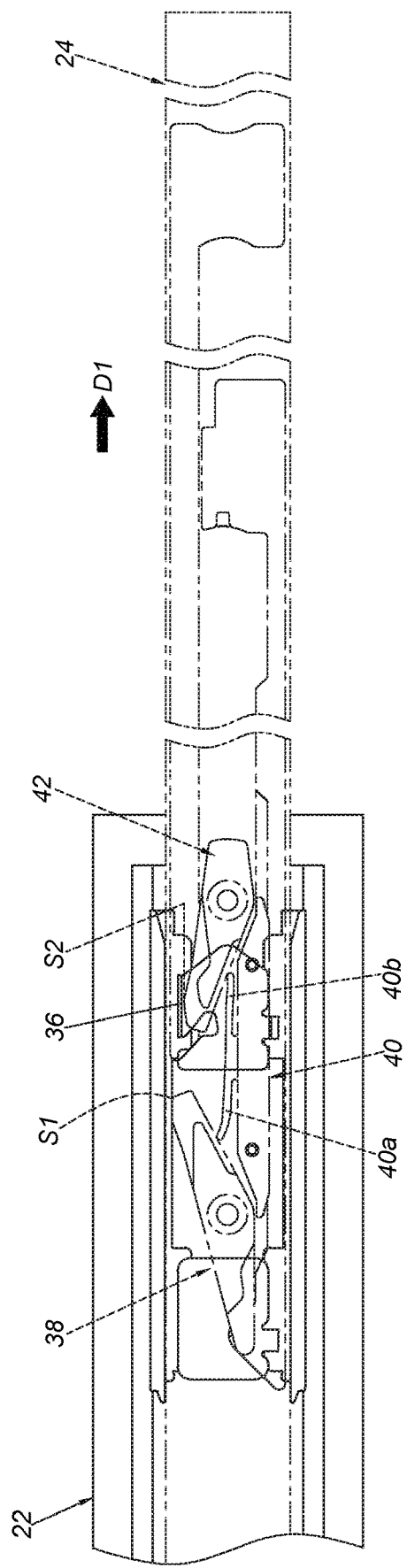

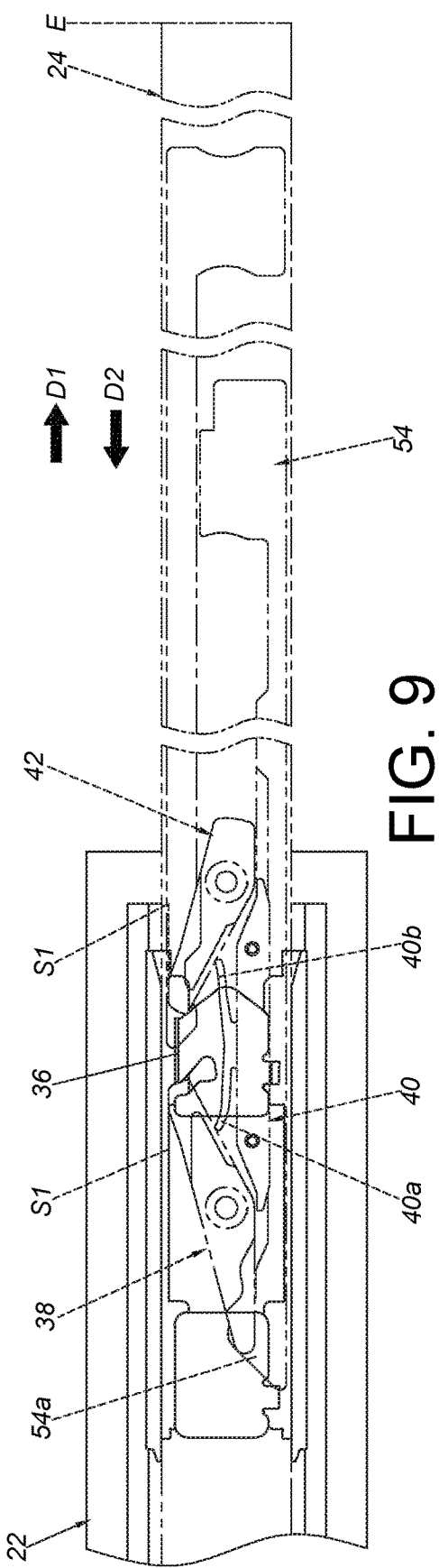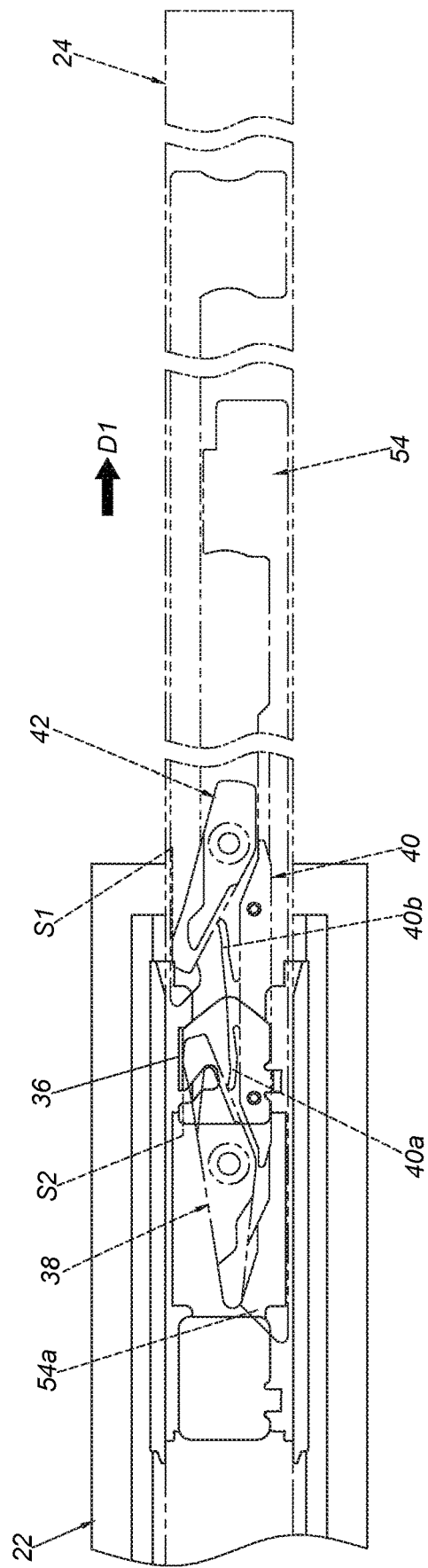
FIG. 9
FIG. 10

SLIDE RAIL ASSEMBLY

BACKGROUND OF THE INVENTION

1. Field of the Invention

The present invention relates to a slide rail assembly, and more particularly, to a slide rail assembly with reliable quality.

2. Description of the Prior Art

U.S. Pat. No. 6,254,210 B1 discloses a slide rail assembly with a bearing retainer and a guide block. The slide rail assembly comprises an outer slide member (11), an intermediate slide member (21) and an inner slide member (31). Wherein, a bearing retainer (41) is arranged between the inner slide member (31) and the intermediate slide member (21), and the bearing retainer (41) has a protrusion (63) to be engaged with a recess (67) of a guide block (68).

U.S. Pat. No. 6,851,773 B2 discloses a slide rail assembly comprising a first track (10), a second track (20) and a slide-aiding member (30) arranged between the first track (10) and the second track (20). Wherein, when the second track (20) is removed from the first track (10) along an open direction, a hook (43) of a retaining member (40) arranged on the first track (10) is configured to be engaged with a hook (32) of the slide-aiding member (30), so as to hold the slide-aiding member (30) at one position. As such, when the second track (20) is reinserted into a passage of the first track (10) from outside of the passage of the first, track (10), the slide-aiding member (30) can support a specific portion of the second track (20).

FIG. 1 and FIG. 2 are diagrams showing a slide rail assembly of the prior art. As shown in FIG. 1 and FIG. 2, a slide rail assembly 100 of the prior art comprises a first rail 102, a second rail 104 longitudinally movable relative to the first rail 102, and a ball device 106 arranged between the first rail 102 and the second rail 104 in order to improve moving smoothness of the second rail 104 relative to the first rail 102. Wherein, a diameter of an area A is defined by a length K1 of an elastic arm 109 of an engaging member 108. The area A is arranged with the engaging member 108 and a blocking base 110 adjacent to a front end 102a of the first rail 102. Two guiding bars 112 are substantially located at two opposite sides of the area A. Furthermore, the elastic arm 109 of the engaging member 108 is configured to be engaged with a hook 107 of the ball device 106, so as to temporarily hold the ball device 106 at one position. On the other hand, when the second rail 104 is located at an open position relative to the first rail 102, a blocking part 111 of the blocking base 110 is configured to block a rotary blocking member (not shown in figures) on the second rail 104, in order to prevent the second rail 104 from moving along an open direction from the open position. When the rotary blocking member is operated to be no longer blocked by the blocking base 110, the second rail 104 can be further moved along the open direction to be detached from the passage of the first rail 102.

When a user is going to mount the second rail 104 once again into the passage of the first rail 102 from outside of the first rail 102 along a retracted direction D, the two guiding bars 112 can be used to support an upper wall and a lower wall of an end portion of the second rail 104 in advance, in order to assist the rest portion of the second rail 104 in gradually entering the passage of the first rail 102 along the retracted direction D to be further supported by the ball device 106. Wherein, since the engaging member 108 and the blocking base 110 are arranged in the same area A, the ball device 106 is close to the area A of the first rail 102 when the ball device 106 is engaged with the elastic arm 109 of the engaging member 108. As such, if a longitudinal length of the guiding bar 112 is too short, the end portion of the second rail 104 supported by the guiding bars 112 may be unstable due to insufficient support. In such state, an end 104a of the second rail 104 may impact a ball 106a or a front part of the ball device 106 due to slight deflection, such that the ball device 106 may be deformed or damaged. Or, if the longitudinal length of the guiding bar 112 is too short, the end portion of the second rail 104 supported by the ball device 106 is prone to shaking due to tolerances between the ball 106a and the rail, such that smoothness of the second rail 104 being mounted to the first rail 102 is affected. Therefore, it is important to develop a different slide rail product.

SUMMARY OF THE INVENTION

The present invention relates to a slide rail assembly capable of improving stability in mounting one rail to another rail.

According to an embodiment of the present invention, a slide rail assembly comprises a first rail, a second rail, a slide assisting device, an engaging member, a blocking structure and at least one supporting structure. The first rail comprises an upper wall, a lower wall and a longitudinal wall connected between the upper wall and the lower wall. A passage is defined by the upper wall, the lower wall and the longitudinal wall. The second rail is movably mounted in the passage of the first rail. The slide assisting device is configured to assist in relative movement between the second rail and the first rail. The engaging member is arranged on a first area of the longitudinal wall of the first rail. The blocking structure is arranged on a second area of the longitudinal wall of the first rail. The at least one supporting structure is arranged on the first rail. Wherein, the first area and the second area are spaced apart from each other along a longitudinal direction of the first rail by a predetermined longitudinal distance, and the first area is further away from a passage entrance of the passage than the second area.

Preferably, a diameter of the first area is defined by a length of the engaging member.

Preferably, the slide rail assembly further comprises a first working member operatively connected to the second rail. When the second rail is moved relative to the first rail from a retracted position to an open position along a first direction, the second rail is configured to be blocked by the blocking structure through the first working member in a predetermined state, in order to prevent the second rail from being moved from the open position along the first direction. When the first working member is operated to be no longer in the predetermined state, the second rail is movable from the open position along the first direction to be outside the passage of the first rail. During a process of the second rail being moved relative to the first rail from the retracted position along the first direction to be outside the passage of the first rail, the slide assisting device is configured to be engaged with the engaging member in response to movement of the second rail. During a process of the second rail being moved from outside of the passage of the first rail toward the retracted position along a second direction through the passage entrance of the first rail, the at least one supporting structure is configured to support the second rail.

Preferably, the slide assisting device is configured to move to be engaged with an engaging arm of the engaging member in response to the movement of the second rail. The at least one supporting structure comprises a supporting section configured to support the second rail. The supporting section has a first end and a second end. The first end is close to the engaging member, and the second end is close to the blocking structure.

Preferably, the at least one supporting structure comprises a guiding part, and the guiding part has an inclined surface or an arc surface configured to guide the second rail to enter the passage of the first rail from the passage entrance of the first rail.

Preferably, the slide assisting device comprises a holder movably mounted in the passage of the first rail. The holder has an upper supporting wall, a lower supporting wall and a side wall connected between the upper supporting wall and the lower supporting wall. The upper supporting wall and the lower supporting wall are respectively arranged with a plurality of rolling members configured to support between the first rail and the second rail.

Preferably, the first working member is pivoted to the second rail, and the slide rail assembly further comprises an elastic base having a first elastic part configured to provide an elastic force to the first working member.

Preferably, the slide rail assembly further comprises a second working member pivoted to the second rail. The elastic base further has a second elastic part configured to provide an elastic force to the second working member. When the second rail is located at the open position relative to the first rail, the first working member and the second working member are configured to be located at two opposite sides of the blocking structure respectively.

Preferably, the slide rail assembly comprises two supporting structures respectively arranged adjacent to the upper v/all and the lower wall of the first rail and configured to support two opposite portions of the second rail.

Preferably, each of the supporting structures has a mounting structure configured to be mounted to a corresponding feature of the first rail.

Preferably, the slide rail assembly further comprises a fixing base attached to the longitudinal wall of the first rail. The fixing base is configured to press each of the supporting structures. The blocking structure is arranged on the fixing base, and the blocking structure is laterally protruded relative to the longitudinal wall of the first rail.

Preferably, the slide rail assembly further comprises a connecting base arranged on the longitudinal wall of the first rail. The connecting base has a supporting part configured to support the engaging arm of the engaging member.

According to another embodiment of the present invention, a slide rail assembly comprises a first rail, a second rail, a slide assisting device, an engaging member and at least one supporting structure. The first rail has a passage. The second rail is movably mounted in the passage of the first rail. The slide assisting device is configured to assist in relative movement between the second rail and the first rail. The engaging member is arranged on the first rail. The at least one supporting structure is arranged on the first rail. Wherein, the second rail is movable relative to the first rail from a retracted position along a first direction to be outside the passage of the first rail. Wherein, during a process of the second rail being moved relative to the first rail from the retracted position along the first direction to be outside the passage of the first rail, the slide assisting device is configured to move to be adjacent to an engaging part of an engaging arm of the engaging member in response to movement of the second rail. Wherein, during a process of the second rail being moved from outside of the passage of the first rail toward the retracted position along a second direction through a passage entrance of the first rail, a supporting section of the at least one supporting structure is configured to support the second rail. Wherein, the supporting section of the at least one supporting structure has a first end and a second end, and the second end is extended a distance beyond the engaging member along the first direction.

Preferably, the engaging part of the engaging arm of the engaging member is extended beyond the first end of the supporting section of the at least one supporting structure along the second direction, and the slide assisting device is configured to be engaged with the engaging part of the engaging arm of the engaging member in response to the movement of the second rail.

Preferably, a length of the supporting section of the at least one supporting structure is at least twice greater than a length of the engaging arm of the engaging member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a diagram showing a second rail of a slide rail assembly of the prior art to be mounted to a passage of a first rail;

FIG. 2 is a diagram showing a process of the second rail of the slide rail assembly of the prior art being mounted to the passage of the first rail;

FIG. 7 is a diagram showing a second rail of the slide rail assembly being moved relative to a first rail along a first direction toward an open position according to an embodiment of the present invention;

FIG. 8 is a diagram showing the second rail of the slide rail assembly being further moved relative to the first rail along the first direction according to an embodiment of the present invention;

FIG. 9 is a diagram showing the second rail of the slide rail assembly being located at the open position relative to the first rail according to an embodiment of the present invention;

FIG. 10 is a diagram showing the second rail of the slide rail assembly being further moved relative to the first rail from the open position along the first direction according to an embodiment of the present invention;

DETAILED DESCRIPTION

Figure 3:
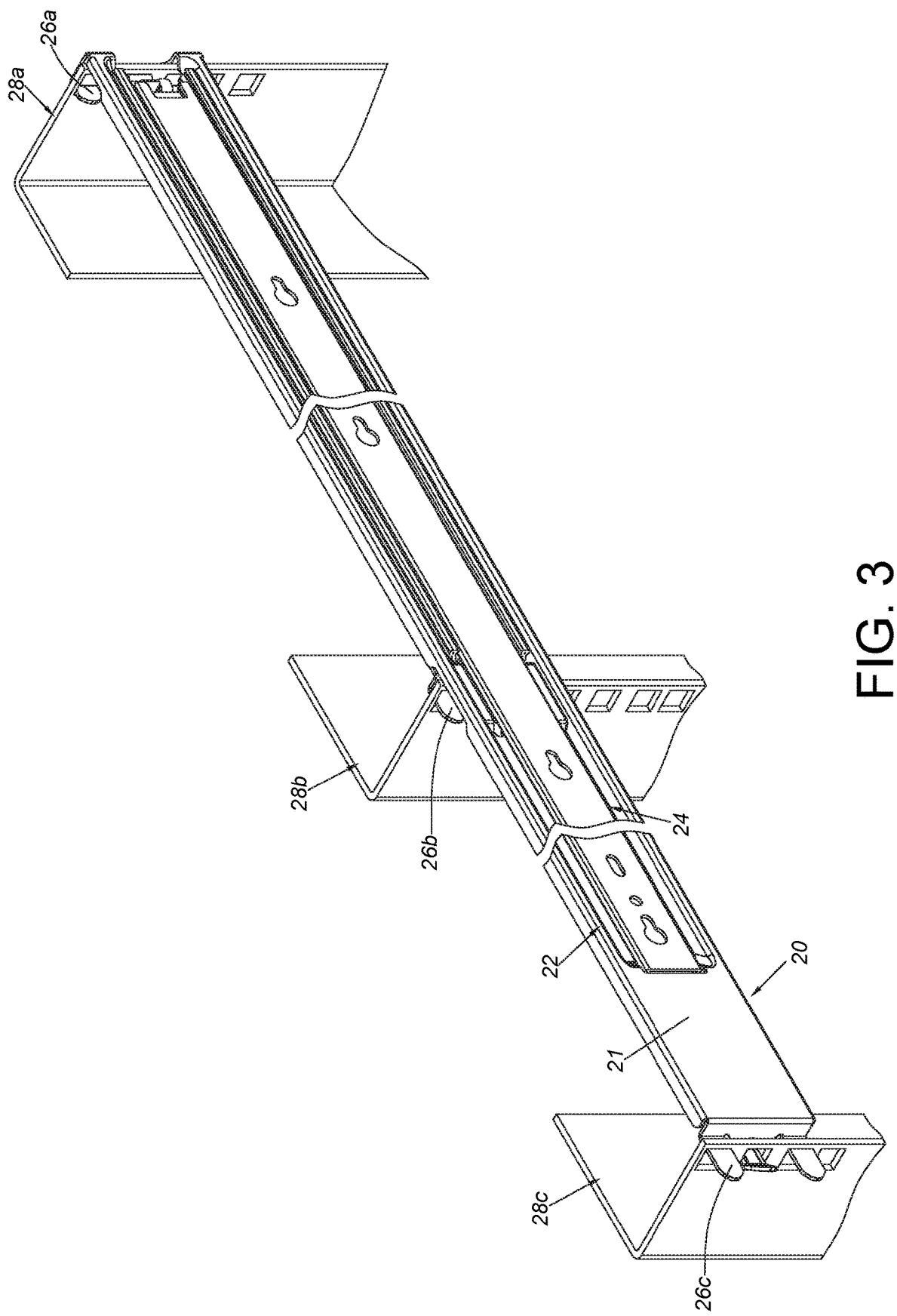
FIG. 3 is a diagram showing a slide rail assembly being mounted to a rack according to an embodiment of the present invention.

As shown in FIG. 3, a slide rail assembly 20 comprises a first rail 22 and a second rail 24 movably mounted to the first rail 22 according to an embodiment of the present invention. In the present embodiment, the first rail 22 is connected to a bracket 21. The bracket 21 is arranged with at least one mounting part, such as a first mounting part 26a, a second mounting part 26b and a third mounting part 26c configured to pass through holes of a first post 28a, a second post 28b and a third post 28c of a rack respectively.

Figure 4:
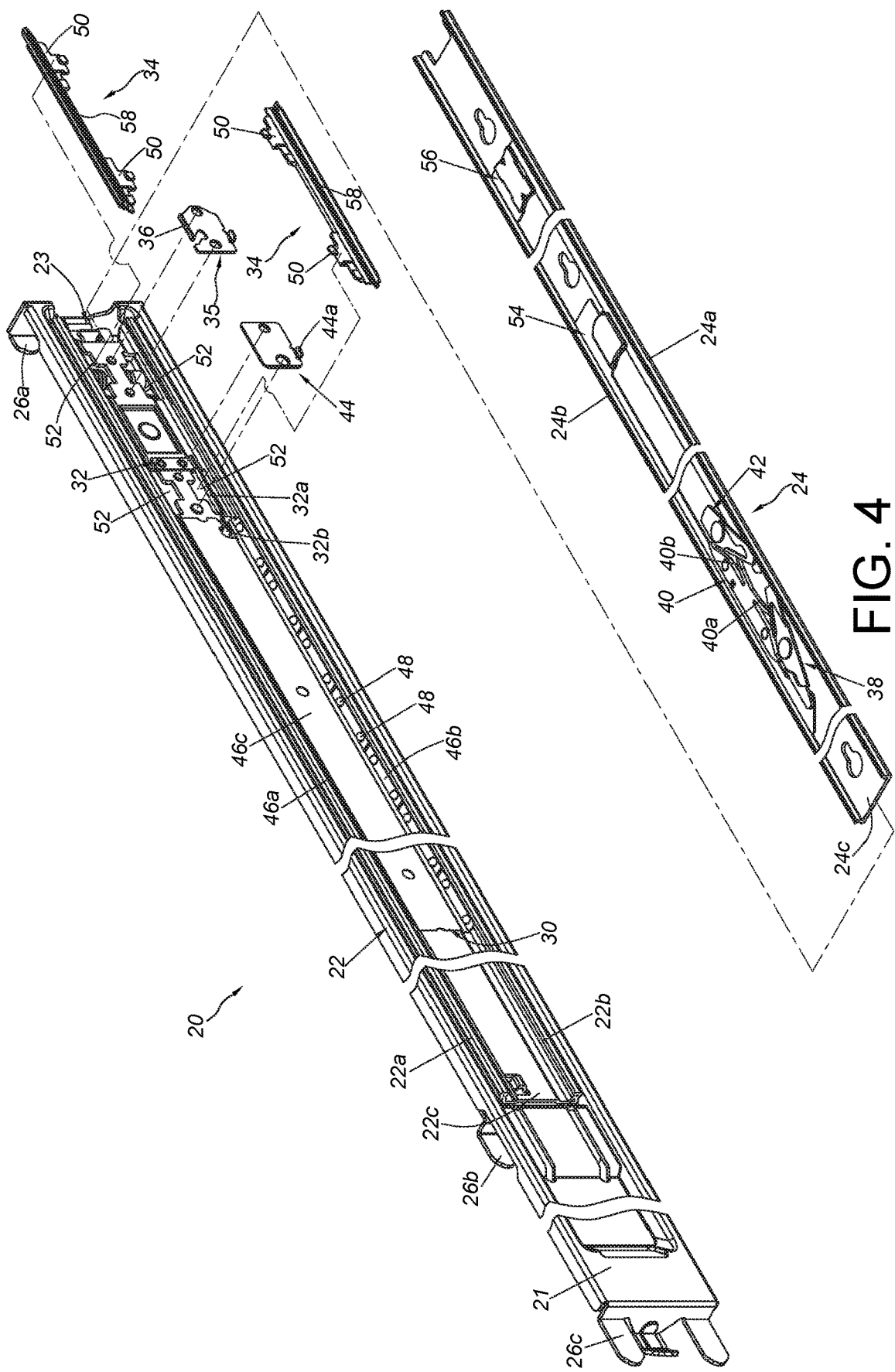
FIG. 4 is an exploded view of the slide rail assembly according to an embodiment of the present invention.
Figure 5:
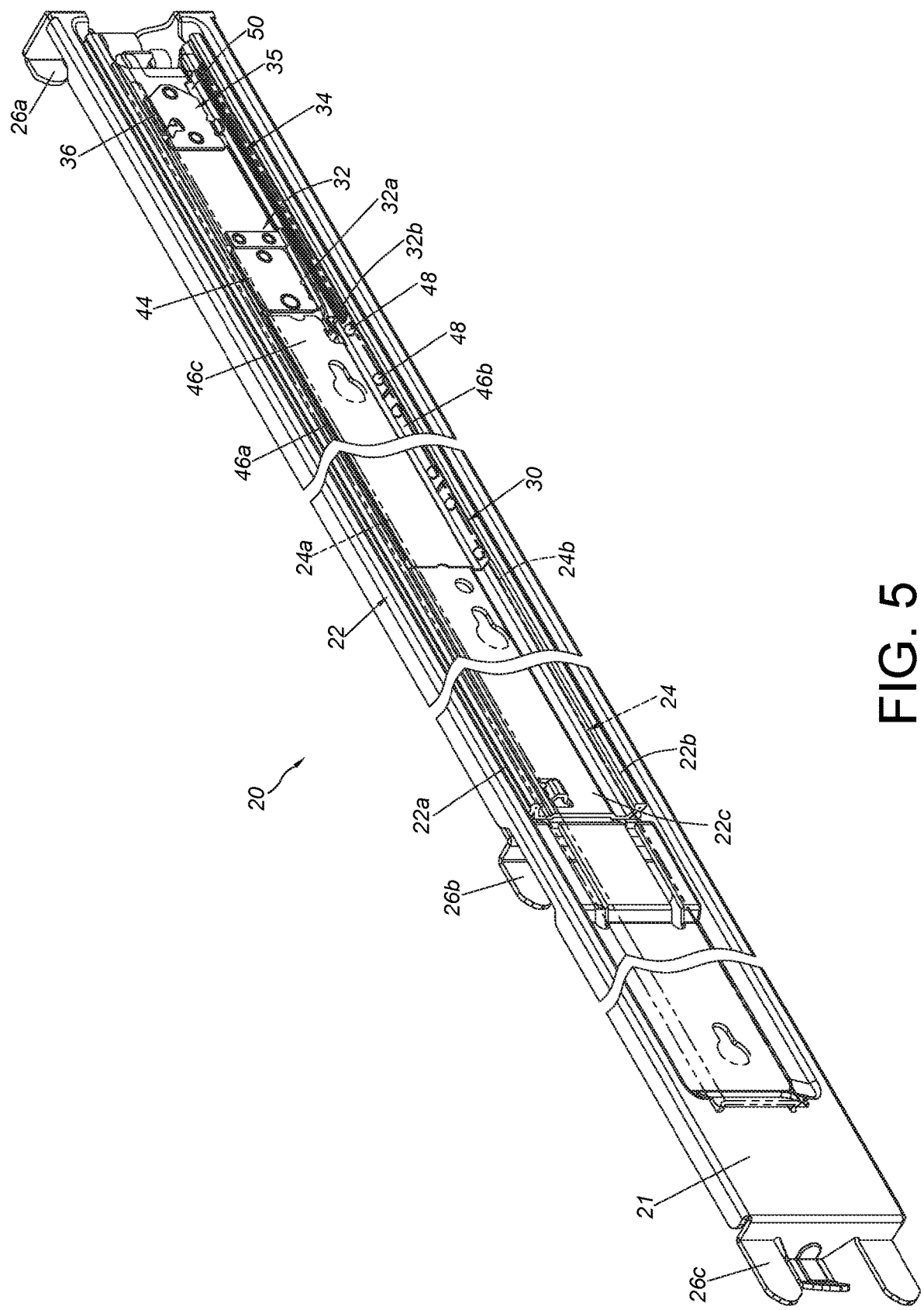
FIG. 5 is a diagram showing the slide rail assembly according to an embodiment of the present invention.

As shown in FIG. 4 and FIG. 5, the first rail 22 has a passage 23. Preferably, the first rail 22 comprises an upper wall 22a, a lower wall 22b and a longitudinal wall 22c connected between the upper wall 22a and the lower wall 22b. The passage 23 is defined by the upper wall 22a, the lower wall 22b and the longitudinal wall 22c. On the other hand, the second rail 24 is movably mounted in the passage 23 of the first rail 22. The second rail 24 comprises an upper wall 24a, a lower wall 24b and a longitudinal wall 24c connected between the upper wall 24a and the lower wall 24b. The upper wall 24a, the lower wall 24b and the longitudinal wall 24c of the second rail 24 respectively correspond to the upper wall 22a, the lower wall 22b and the longitudinal wall 22c of the first rail 22.

Moreover, the slide rail assembly 20 further comprises a slide assisting device 30, an engaging member 32 and at least one supporting structure 34. Preferably, the slide rail assembly 20 further comprises a blocking structure 36, a first working member 38, an elastic base 40, a second working member 42 and a connecting base 44.

The slide assisting device 30 is configured to assist in relative movement between the second rail 24 and the first rail 22. Preferably, the slide assisting device 30 is movably mounted in the passage 23 of the first rail 22, and comprises a holder. The holder has an upper supporting wall 46a, a lower supporting wall 46b and a side wall 46c connected between the upper supporting wall 46a and the lower supporting wall 46b. The upper supporting wall 46a and the lower supporting wall 46b are respectively arranged with a plurality of rolling members 48 (such as balls or rollers) configured to provide support between the first rail 22 and the second rail 24. Wherein, the rolling members on the upper supporting wall 46a of the slide assisting device 30 are not shown in figures due to the viewing angle.

The engaging member 32 and the blocking structure 36 are arranged on the first rail 22. Specifically, the engaging member 32 and the blocking structure 36 are respectively arranged at two different positions on the longitudinal wall 22c of the first rail 22. Wherein, the engaging member 32 is connected to the first rail 22. In the present embodiment, the engaging member 32 is fixed to the longitudinal wall 22c of the first rail 22. The engaging member 32 comprises an engaging arm 32a and an engaging part 32b arranged on the engaging arm 32a. Preferably, the engaging arm 32a is an elastic arm, and the engaging part 32b is adjacent to an end part of the engaging arm 32a. On the other hand, the blocking structure 36 can be integrally arranged on the longitudinal wall 22c of the first rail 22 and laterally protruded relative to the longitudinal wall 22c of the first rail 22. Preferably, the slide rail assembly 20 further comprises a fixing base 35 attached (such as fixed) to the longitudinal wall 22c of the first rail 22, and the blocking structure 36 is arranged on the fixing base 35.

The at least one supporting structure 34 has a predetermined longitudinal length and is arranged on the first rail 22. In the present embodiment, the slide rail assembly 20 comprises two supporting structures 34 arranged respectively adjacent to the upper wall 22a and the lower wall 22b of the first rail 22, and configured to respectively support two opposite portions of the second rail 24 (such as the upper wall 24a and the lower wall 24b of the second rail 24). Preferably, each of the supporting structures 34 has a plurality of mounting structures 50 configured to be mounted to a plurality of corresponding features 52 of the longitudinal wall 22c of the first rail 22. For example, the mounting structure 50 and the corresponding feature 52 can be a combination of convex and concave (hole) structures, but the present invention is not limited thereto. As such, the supporting structure 34 can be mounted to the first rail 22. Preferably, the fixing base 35 is configured to press one of the mounting structures 50 of each supporting structure 34. On the other hand, the connecting base 44 is arranged on the longitudinal wall 22c of the first rail 22, and is configured to press another mounting structure 50 of each supporting structure 34. As such, stability and reliability of each supporting structure 34 mounted to the first rail 22 can be enhanced.

Figure 6:
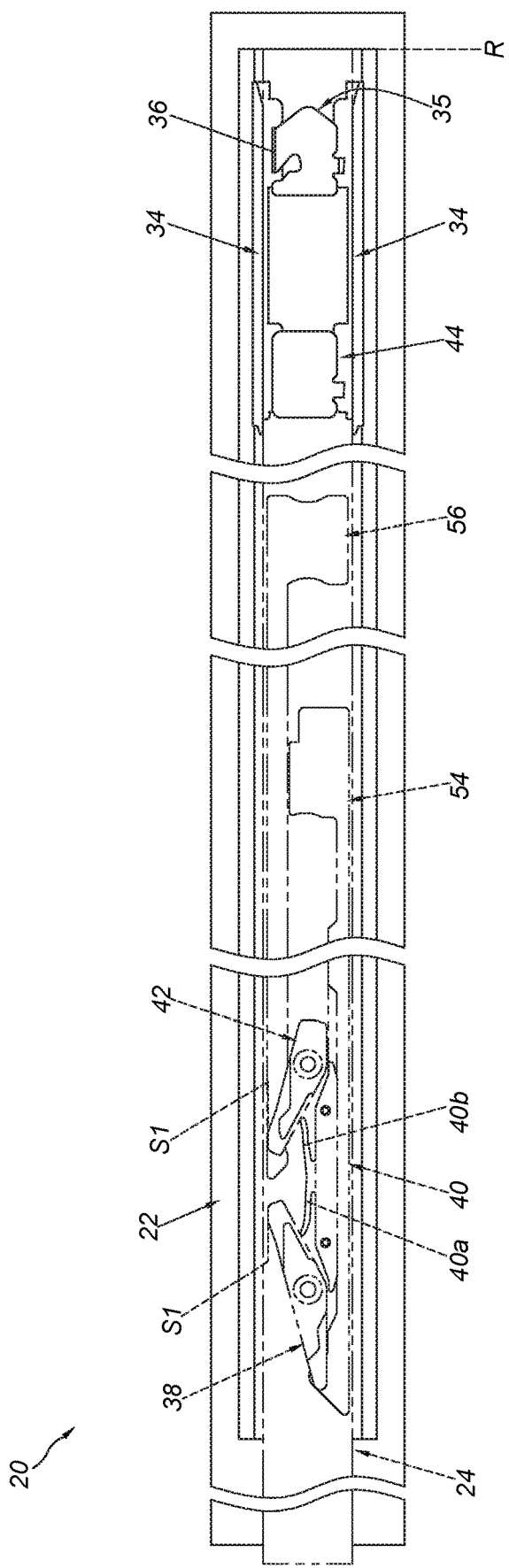
FIG. 6 is a diagram showing the slide rail assembly being in a retracted state according to an embodiment of the present invention.

The first working member 38, the second working member 42 and the elastic base 40 are arranged on the second rail 24. Preferably, the first working member 38, the second working member 42 and the elastic base 40 are arranged on the longitudinal wall 24c of the second rail 24 (please refer to FIG. 4, since the first working member 38, the second working member 42 and the elastic base 40 are not shown in FIG. 5). Wherein, the first working member 38 and the second working member 42 are configured to be operatively connected to the second rail 24. Preferably, the first working member 38 and the second working member 42 are respectively pivoted to two different positions on the second rail 24. On the other hand, the elastic base 40 has a first elastic part 40a and a second elastic part 40b configured to provide elastic forces to the first working member 38 and the second working member 42 respectively, so as to hold the first working member 38 and the second working member 42 in a predetermined state. Preferably, the slide rail assembly 20 further comprises a first operating member 54 and a second operating member 56 configured to allow a user to respectively operate the first working member 38 and the second working member 42 to be no longer in the predetermined state. Such configuration is well known to those skilled in the art. For simplification, no further illustration is provided As shown in FIG. 6, the second rail 24 of the slide rail assembly 20 is located at a retracted position R relative to the first rail 22. Wherein, the first working member 38 and the second working member 42 are respectively held in the predetermined state (such as a first state S1) by elastic forces provided by the first elastic part 40a and the second elastic part 40b of the elastic base 40. Wherein, the first working member 38 (or the second working member 42) has a predetermined distance away from the blocking structure 36. Moreover, for simplification of figures, the slide assisting device 30 and the engaging member 32 are omitted in FIG. 6, FIG. 7, FIG. 8, FIG. 9 and FIG. 10, so as to clearly show interaction between the first working member 38 and the blocking structure 36 and interaction between the second working member 42 and the blocking structure 36.

As shown in FIG. 7, FIG. 8 and FIG. 9, during a process of the second rail 24 being moved relative to the first rail 22 from the retracted position R along a first direction D1, the second working member 42 contacts a first side of the blocking structure 36 (as shown in FIG. 7). When the second rail 24 is further moved relative to the first rail 22 along the first direction D1, the second working member 42 interacts with the blocking structure 36, such that the second working member 42 is deflected from the predetermined state (such as the first state S1) to another state (such as a second state S2 shown in FIG. 8) to cross the first side of the blocking structure 36. Meanwhile, the second elastic part 40b is in a state of accumulating elastic force. When the second rail 24 is further moved relative to the first rail 22 along the first direction D1 to an open position E, such as a completely open position (as shown in FIG. 9), the second working member 42 returns to the predetermined state (such as the first state S1) in response to the elastic force of the second elastic part 40b. Meanwhile, the second working member 42 is located at a second side of the blocking structure 36 (as shown in FIG. 9). On the other hand, the first working member 38 is in the predetermined state (such as the first state S1) and located at the first side of the blocking structure 36. Briefly, when the second rail 24 is located at the open position E relative to the first rail 22 (as shown in FIG. 9), the first working member 38 and the second working member 42 are in the predetermined state (the first state S1) and respectively located at the first side and the second side of the blocking structure 36 to be blocked by the blocking structure 36, in order to prevent the second rail 24 from being moved from the open position E along the first direction D1 or a second direction D2.

Figure 11:
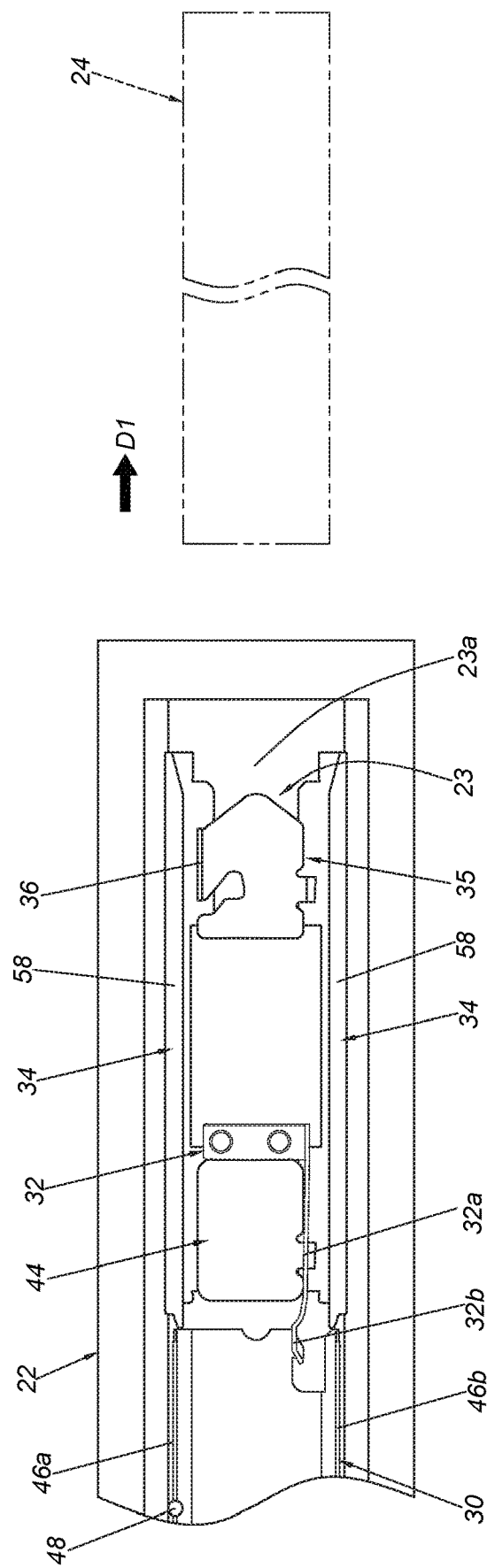
FIG. 11 is a diagram showing the second rail of the slide rail assembly being detached from the first rail according to an embodiment of the present invention.

As shown in FIG. 9 and FIG. 10, when the user is going to move the second rail 24 from the open position E along the first direction D1 or a second direction D2, the first working member 38 or the second working member 42 can be operated by the user to be no longer in the predetermined state (the first state S1). For example, the user can apply a force to the first operating member 54 along the first direction D1, such that the a driving part 54a of the first operating member 54 can drive the first working member 38 to deflect from the predetermined state (the first state S1) to another state (such as the second state S2 shown in FIG. 10) to allow the second rail 24 to move outside the passage 23 of the first rail 22 from the open position E along the first direction D1. Specifically, the second rail 24 can be detached from the first rail 22 through the passage entrance 23a of the passage 23 of the first rail 22 (as shown in FIG. 11). Moreover, the first working member 38, the second working member 42 and the elastic base 40 are omitted in FIG. 11. In addition, during the process of the second rail 24 being moved relative to the first rail 22 from the retracted position R to be outside the passage 23 of the first rail 22 along the first direction D1, the slide assisting device 30 is moved to be adjacent to the engaging part 32b of the engaging arm 32a of the engaging member 32 in response to the movement of the second rail 24 along the first direction D1. In the present embodiment, the slide assisting device 30 is moved to be engaged with the engaged part 32b of the engaging arm 32a of the engaging member 32. Each of the supporting structures 34 is configured to block the upper supporting wall 46a and the lower supporting wall 46b of the slide assisting device 30 in order to prevent the slide assisting device 30 from moving along the first direction D1.

Moreover, when the second rail 24 is moved along the first direction D1, the slide assisting device 30 can be moved differentially along the first direction D1 in response to the movement of the second rail 24, or the slide assisting device 30 can be forced to move by a portion of the second rail 24.

The slide assisting device 30 can be moved according to the above two configurations to be adjacent to the engaging part 32b of the engaging arm 32a of the engaging member 32 in response to the movement of the second rail 24.

Figure 12:
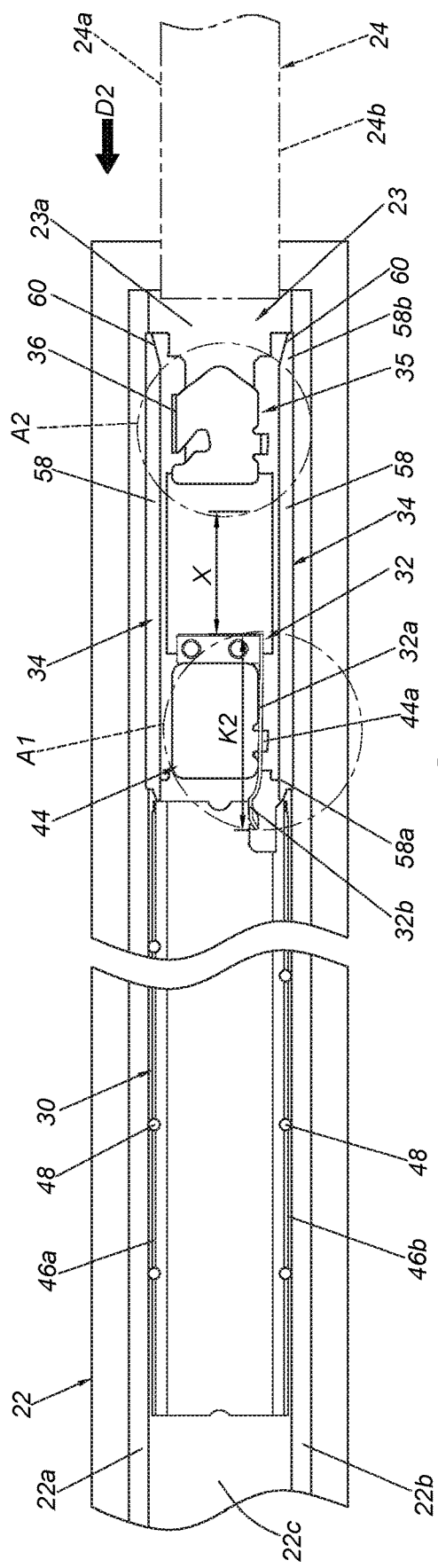
FIG. 12 is a diagram showing the second rail of the slide rail assembly to be mounted into a passage of the first rail along a second direction according to an embodiment of the present invention.

As shown in FIG. 12, the slide assisting device 30 is engaged with the engaging part 32b of the engaging arm 32a of the engaging member 32. Preferably, the connecting base 44 has a supporting part 44a configured to support the engaging arm 32a of the engaging member 32. Furthermore, the engaging member 32 is arranged on a first area A1 of the longitudinal wall 22c of the first rail 22. For example, a diameter of the first area A1 is defined by a length K2 of the engaging arm 32a of the engaging member 32, but the present invention is not limited thereto. Wherein, the first area A1 is not arranged with the blocking structure 36. The blocking structure 36 is arranged on a second area A2 of the longitudinal wall 22c of the first rail 22. The first area A1 and the second area A2 are spaced apart from each other along a longitudinal direction of the first rail 22 by a predetermined longitudinal distance. Wherein, the first area A1 is further away from the passage entrance 23a of the passage 23 than the second area A2; and the second area A2 is closer to the passage entrance 23a of the passage 23 than the first area A1.

Figure 13:
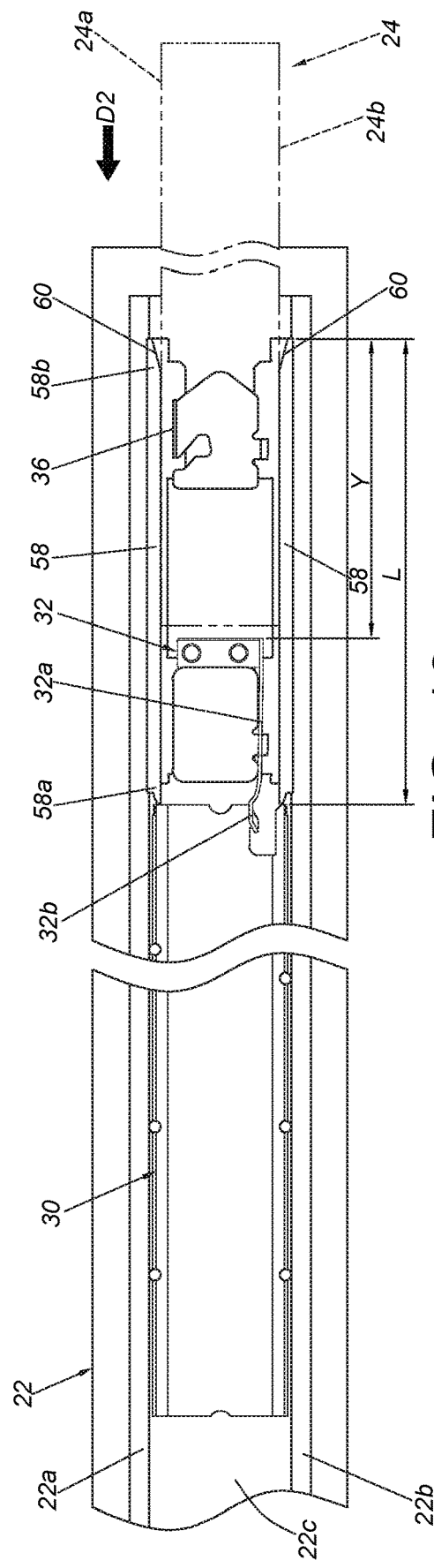
FIG. 13 is a diagram showing a process of the second rail of the slide rail assembly being mounted to the passage of the first rail according to an embodiment of the present invention.

As shown in FIG. 12 and FIG. 13, during a process of the second rail 24 being moved from outside of the passage 23 of the first rail 22 toward the retracted position R along the second direction D2 through the passage entrance 23a of the first rail 22, the two supporting structures 34 are configured to respectively support two portions (such as the upper wall 24a and the lower wall 24b) of the second rail 24. Preferably, each of the supporting structures 34 comprises a supporting section 58 configured to support the second rail 24, and the supporting section 58 has a first end 58a and a second end 58b opposite to the first end 58a. Wherein, the first end 58a is closer to the engaging member 32 than the second end 58b, and the second end 58b is closer to the blocking structure 36 than the first end 58a. Wherein, the second end 58b is extended a predetermined distance Y beyond the engaging member 32 along the first direction D1 (opposite to the second direction D2). Preferably, the engaging part 32b of the engaging arm 32a of the engaging member 32 is extended beyond the first end 58a of the supporting section 58 of the supporting structure 34 along the second direction D2. Specifically, a length L of the supporting section 58 of the supporting structure 34 is at least twice greater than a length of the engaging arm 32a of the engaging member 32.

Preferably, each of the supporting structures 34 comprises a guiding part 60. The guiding part 60 has an inclined surface or an arc surface configured to guide the upper wall 24a or the lower wall 24b at a rear end portion of the second rail 24 to enter the passage 23 of the first rail 22 from the passage entrance 23a of the first rail 22, in order to assist the second rail 24 in entering the passage 23 to be further moved toward the retracted position R along the second direction D2.

In particular, during a process of the second rail. 24 entering the passage 23 of the first rail 22 from the passage entrance 23a of the first rail 22 to the retracted position R along the second direction D2, since the second end 58b of the supporting section 58 of the supporting structure 34 is extended the predetermined distance Y beyond the engaging member 32 along the first direction D1 (opposite to the second direction D2), an extended portion with a length Y of the supporting section 58 is configured to support the second rail 24, in order to improve the stability of the second rail 24 entering the passage 23 of the first rail 22. Meanwhile, since the second rail 24 can stably enter the passage 23 of the first rail 22 deep enough, the second rail 24 can be further stably moved along the second direction D2 in the passage 23 of the first rail 22, in order to prevent the second rail 24 from shaking and impacting the slide assisting device 30 (such as impacting a front end part or the rolling member 48 of the slide assisting device 30), such that the slide assisting device 30 can be protected.

Therefore, the slide rail assembly 20 of the present invention is characterized in that:

1. The second rail 24 can be stably supported without impacting the slide assisting device 30.

2. The blocking structure 36 is arranged adjacent to the passage entrance 23a of the first rail 22, such that an extending distance of the second rail 24 can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising an upper wall, a lower wall and a longitudinal wall connected between the upper wall and the lower wall, a passage being defined by the upper wall, the lower wall and the longitudinal wall;
   a second rail movably mounted in the passage of the first rail;
   a slide assisting device configured to assist in relative movement between the second rail and the first rail;
   an engaging member arranged on a first area of the longitudinal wall of the first rail;
   a blocking structure arranged on a second area of the longitudinal wall of the first rail;
   at least one supporting structure arranged on the first rail; and
   a first working member operatively connected to the second rail;
   wherein the first area and the second area are spaced apart from each other along a longitudinal direction of the first rail by a predetermined longitudinal distance, the first area is further away from a passage entrance of the passage than the second area;
   wherein when the second rail is moved relative to the first rail from a retracted position to an open position along a first direction, the second rail is configured to be blocked by the blocking structure through the first working member in a predetermined state, in order to prevent the second rail from being moved from the open position along the first direction; when the first working member is operated to be no longer in the predetermined state, the second rail is movable from the open position along the first direction to be outside the passage of the first rail; during a process of the second rail being moved relative to the first rail from the retracted position along the first direction to be outside the passage of the first rail, the slide assisting device is configured to be engaged with the engaging member in response to movement of the second rail; and during a process of the second rail being moved from outside of the passage of the first rail toward the retracted position along a second direction through the passage entrance of the first rail, the at least one supporting structure is configured to support the second rail;
   wherein the first working member is pivoted to the second rail, and the slide rail assembly further comprises an elastic base having a first elastic part configured to provide an elastic force to the first working member.

2. The slide rail assembly of claim 1, wherein a diameter of the first area is defined by a length of an engaging arm of the engaging member.

3. The slide rail assembly of claim 1, wherein the slide assisting device is configured to move to be engaged with an engaging arm of the engaging member in response to the movement of the second rail, the at least one supporting structure comprises a supporting section configured to support the second rail, the supporting section has a first end and a second end, the first end is close to the engaging member, and the second end is close to the blocking structure.

4. The slide rail assembly of claim 3, further comprising a connecting base arranged on the longitudinal wall of the first rail, wherein the connecting base has a supporting part configured to support the engaging arm of the engaging member.

5. The slide rail assembly of claim 1, wherein the at least one supporting structure comprises a guiding part, and the guiding part has an inclined surface or an arc surface configured to guide the second rail to enter the passage of the first rail from the passage entrance of the first rail.

6. The slide rail assembly of claim 1, wherein the slide assisting device comprises a holder movably mounted in the passage of the first rail, the holder has an upper supporting wall, a lower supporting wall and a side wall connected between the upper supporting wall and the lower supporting wall, the upper supporting wall and the lower supporting wall are respectively arranged with a plurality of rolling members configured to support between the first rail and the second rail.

7. The slide rail assembly of claim 1, further comprising a second working member pivoted to the second rail, wherein the elastic base further has a second elastic part configured to provide an elastic force to the second working member; when the second rail is located at the open position relative to the first rail, the first working member and the second working member are configured to be located at two opposite sides of the blocking structure respectively.

8. The slide rail assembly of claim 1, further comprising two supporting structures respectively arranged adjacent to the upper wall and the lower wall of the first rail and configured to support two opposite portions of the second rail.

9. The slide rail assembly of claim 8, wherein each of the supporting structures has a mounting structure configured to be mounted to a corresponding feature of the first rail.

10. The slide rail assembly of claim 9, further comprising a fixing base attached to the longitudinal wall of the first rail, wherein the fixing base is configured to press each of the supporting structures, the blocking structure is arranged on the fixing base, and the blocking structure is laterally protruded relative to the longitudinal wall of the first rail.

11. A slide rail assembly, comprising:
    a first rail having a passage;
    a second rail movably mounted in the passage of the first rail;
    a slide assisting device configured to assist in relative movement between the second rail and the first rail;
    an engaging member arranged on the first rail;
    a first working member operatively connected to the second rail; and
    a blocking structure arranged on the first rail;
    at least one supporting structure arranged on the first rail;

wherein the second rail is movable relative to the first rail from a retracted position along a first direction to be outside the passage of the first rail;

wherein during a process of the second rail being moved relative to the first rail from the retracted position along the first direction to be outside the passage of the first rail, the slide assisting device is configured to move to be adjacent to an engaging part of an engaging arm of the engaging member in response to movement of the second rail;

wherein during a process of the second rail being moved from outside of the passage of the first rail toward the retracted position along a second direction through a passage entrance of the first rail, a supporting section of the at least one supporting structure is configured to support the second rail;

wherein the supporting section of the at least one supporting structure has a first end and a second end, and the second end is extended a distance beyond the engaging member along the first direction;

wherein when the second rail is moved relative to the first rail from the retracted position to an open position along the first direction, the second rail is configured to be blocked by the blocking structure through the first working member in a predetermined state, in order to prevent the second rail from being moved from the open position along the first direction; wherein when the first working member is operated to be no longer in the predetermined state, the second rail is movable from the open position along the first direction to be outside the passage of the first rail;

wherein the first working member is pivoted to the second rail, the slide rail assembly further comprises an elastic base having a first elastic part configured to provide an elastic force to the first working member, the slide rail assembly further comprises a second working member pivoted to the second rail, and the elastic base further has a second elastic part configured to provide an elastic force to the second working member; when the second rail is located at the open position relative to the first rail, the first working member and the second working member in the predetermined state are configured to be located at two opposite sides of the blocking structure respectively, in order to prevent the second rail from being moved from the open position along the first direction or the second direction.

12. The slide rail assembly of claim 11, wherein the engaging part of the engaging arm of the engaging member is extended beyond the first end of the supporting section of the at least one supporting structure along the second direction, and the slide assisting device is configured to be engaged with the engaging part of the engaging arm of the engaging member in response to the movement of the second rail.

13. The slide rail assembly of claim 11, wherein a length of the supporting section of the at least one supporting structure is at least twice greater than a length of the engaging arm of the engaging member.

14. The slide rail assembly of claim 11, wherein the at least one supporting structure comprises a guiding part configured to guide the second rail to enter the passage of the first rail from the passage entrance of the first rail.

15. The slide rail assembly of claim 11, wherein the slide assisting device is movably mounted in the passage of the first rail and comprises an upper supporting wall and a lower supporting wall, the upper supporting wall and the lower supporting wall are respectively arranged with a plurality of rolling members configured to support between the first rail and the second rail.

16. The slide rail assembly of claim 11, further comprising two supporting structures respectively arranged adjacent to the upper wall and the lower wall of the first rail and configured to support two opposite portions of the second rail.

17. A slide rail assembly, comprising:
a first rail comprising an upper wall, a lower wall and a longitudinal wall connected between the upper wall and the lower wall, a passage being defined by the upper wall, the lower wall and the longitudinal wall;
a second rail movably mounted in the passage of the first rail;
a slide assisting device configured to assist in relative movement between the second rail and the first rail;
an engaging member arranged on a first area of the longitudinal wall of the first rail;
a blocking structure arranged on a second area of the longitudinal wall of the first rail;
at least one supporting structure arranged on the first rail; and
a first working member operatively connected to the second rail;
wherein the first area and the second area are spaced apart from each other along a longitudinal direction of the first rail by a predetermined longitudinal distance, the first area is further away from a passage entrance of the passage than the second area;
wherein when the second rail is moved relative to the first rail from a retracted position to an open position along a first direction, the second rail is configured to be blocked by the blocking structure through the first working member in a predetermined state, in order to prevent the second rail from being moved from the open position along the first direction; when the first working member is operated to be no longer in the predetermined state, the second rail is movable from the open position along the first direction to be outside the passage of the first rail; during a process of the second rail being moved relative to the first rail from the retracted position along the first direction to be outside the passage of the first rail, the slide assisting device is configured to be engaged with the engaging member in response to movement of the second rail; and during a process of the second rail being moved from outside of the passage of the first rail toward the retracted position along a second direction through the passage entrance of the first rail, the at least one supporting structure is configured to support the second rail;
wherein the slide rail assembly further comprises two supporting structures respectively arranged adjacent to the upper wall and the lower wall of the first rail and configured to support two opposite portions of the second rail;
wherein each of the supporting structures has a mounting structure configured to be mounted to a corresponding feature of the first rail;
wherein the slide rail assembly further comprises a fixing base attached to the longitudinal wall of the first rail, wherein the fixing base is configured to press each of the supporting structures, the blocking structure is arranged on the fixing base, and the blocking structure is laterally protruded relative to the longitudinal wall of the first rail.

* * * * *